United States Patent
Kikuchi et al.

(10) Patent No.: US 8,552,469 B2
(45) Date of Patent: Oct. 8, 2013

(54) SEMICONDUCTOR DEVICE

(75) Inventors: Shuichi Kikuchi, Gunma (JP); Shigeaki Okawa, Tochigi (JP); Kiyofumi Nakaya, Saitama (JP); Shuji Tanaka, Gunma (JP)

(73) Assignees: SANYO Semiconductor Co., Ltd., Gunma (JP); Semiconductor Components Industries, LLC, Phoenix, AZ (US)

( * ) Notice: Subject to any disclaimer, the term of this patent is extended or adjusted under 35 U.S.C. 154(b) by 606 days.

(21) Appl. No.: 11/862,585

(22) Filed: Sep. 27, 2007

(65) Prior Publication Data

US 2008/0164556 A1 Jul. 10, 2008

(30) Foreign Application Priority Data

Sep. 28, 2006 (JP) .................................. 2006-265385

(51) Int. Cl.
 *H01L 29/66* (2006.01)
 *H01L 29/47* (2006.01)
(52) U.S. Cl.
 USPC ........... 257/183; 257/471; 257/141; 257/162; 257/E27.04; 257/484
(58) Field of Classification Search
 USPC ......... 257/355, 565, 347, 530, 533, 471, 502, 257/324, 409, 547, 483, 580, 127, 481, 484, 257/487, 488, 492, 493, E27.04, 605, 257/E29.335, 12, 49, 51, 54, 121, 122, 141, 257/149, 162, 183, 490, 629, 630
 See application file for complete search history.

(56) References Cited

U.S. PATENT DOCUMENTS

| 4,027,325 | A | * | 5/1977 | Genesi ........................... 257/547 |
| 4,451,839 | A | * | 5/1984 | Nelson ........................... 257/530 |
| 4,613,887 | A | | 9/1986 | Fukuda et al. |
| 5,101,244 | A | * | 3/1992 | Mori et al. ..................... 257/471 |
| 5,448,100 | A | * | 9/1995 | Beasom ......................... 257/487 |
| 5,468,984 | A | * | 11/1995 | Efland et al. .................. 257/356 |

(Continued)

FOREIGN PATENT DOCUMENTS

| EP | 0 450 306 A1 | | 10/1991 |
| JP | 08-107222 | * | 4/1996 |

(Continued)

OTHER PUBLICATIONS

Perez, R. et al. (2006)."Analysis of 1.2 kV JBS rectifiers fabricated in 4H-SiC." *Semicond.Sci.Technol.* Institute of Physics Publishing. 21:670-676.

(Continued)

*Primary Examiner* — Cuong Q Nguyen
*Assistant Examiner* — Galina Yushina
(74) *Attorney, Agent, or Firm* — Morrison & Foerster LLP

(57) ABSTRACT

There is a problem that a reverse off-leak current becomes too large in a Schottky barrier diode. A semiconductor device of the present invention includes P-type first and second anode diffusion layers formed in an N-type epitaxial layer, N-type cathode diffusion layers formed in the epitaxial layer, a P-type third anode diffusion layer formed in the epitaxial layer so as to surround the first and second anode diffusion layers and to extend toward the cathode diffusion layers, and a Schottky barrier metal layer formed on the first and second anode diffusion layers.

12 Claims, 10 Drawing Sheets

(56) References Cited

U.S. PATENT DOCUMENTS

| | | | |
|---|---|---|---|
| 5,545,909 A | | 8/1996 | Williams et al. |
| 5,552,625 A | * | 9/1996 | Murakami et al. ............ 257/409 |
| 5,770,886 A | * | 6/1998 | Rao et al. ...................... 257/533 |
| 5,982,015 A | * | 11/1999 | Hirayama et al. ............ 257/483 |
| 6,060,752 A | * | 5/2000 | Williams ...................... 257/355 |
| 6,207,484 B1 | | 3/2001 | Kim et al. |
| 6,590,273 B2 | | 7/2003 | Okawa et al. |
| 6,693,308 B2 | * | 2/2004 | Sankin et al. ................. 257/103 |
| 6,693,327 B2 | * | 2/2004 | Priefert et al. ................ 257/347 |
| 2002/0079554 A1 | * | 6/2002 | Okawa et al. ................. 257/565 |
| 2002/0190338 A1 | | 12/2002 | Skocki |
| 2003/0060031 A1 | | 3/2003 | Asano et al. |
| 2004/0173820 A1 | * | 9/2004 | Kinoshita et al. ............. 257/200 |
| 2005/0012181 A1 | | 1/2005 | Kato et al. |
| 2005/0280114 A1 | * | 12/2005 | Singh ............................ 257/502 |
| 2006/0170075 A1 | * | 8/2006 | Takahashi ..................... 257/580 |
| 2006/0220166 A1 | | 10/2006 | Kikuchi et al. |
| 2006/0244050 A1 | * | 11/2006 | Sudou ........................... 257/324 |
| 2008/0079110 A1 | | 4/2008 | Kikuchi et al. |

FOREIGN PATENT DOCUMENTS

| | | |
|---|---|---|
| JP | 08-130317 | 5/1996 |
| JP | 09-121062 | 5/1997 |
| JP | 2001-257367 | 9/2001 |
| JP | 2002-314099 | 10/2002 |
| JP | 2003-158259 | 5/2003 |
| JP | 2006-186392 | 7/2006 |

OTHER PUBLICATIONS

European Search Report, mailed Oct. 22, 2008, directed to European Patent Application No. 07019157.2; 2 pages.

Kikuchi, S. et al.; U.S. Office Action mailed Jan. 12, 2009, directed to U.S. Appl. No. 11/395,599; 11 pages.

Adler et al., (1977). Theory and Breakdown Voltage for Planar Devices with a Single Field Limiting Ring. *IEEE Transaction on Electron Devices* vol. ED-24(2): 107-113.

Kikuchi et al.; U.S. Office Action mailed Jun. 11, 2009, directed to U.S. Appl. No. 11/862,365; (16 pages).

Kikuchi et al.; U.S Office Action mailed on Nov. 30, 2007 directed to U.S. Appl. No. 11/395,599; 10 pages.

Kikuchi et al.; U.S Office Action mailed on May 22, 2007 directed to U.S. Appl. No. 11/395,599; 13 pages.

Kikuchi et al.; U.S Office Action mailed on Jun. 3, 2008 directed to U.S. Appl. No. 11/395,599; 10 pages.

Kikuchi et al.; U.S Office Action mailed on Dec. 20, 2007 directed to U.S. Appl. No. 11/395,599; 11 pages.

* cited by examiner

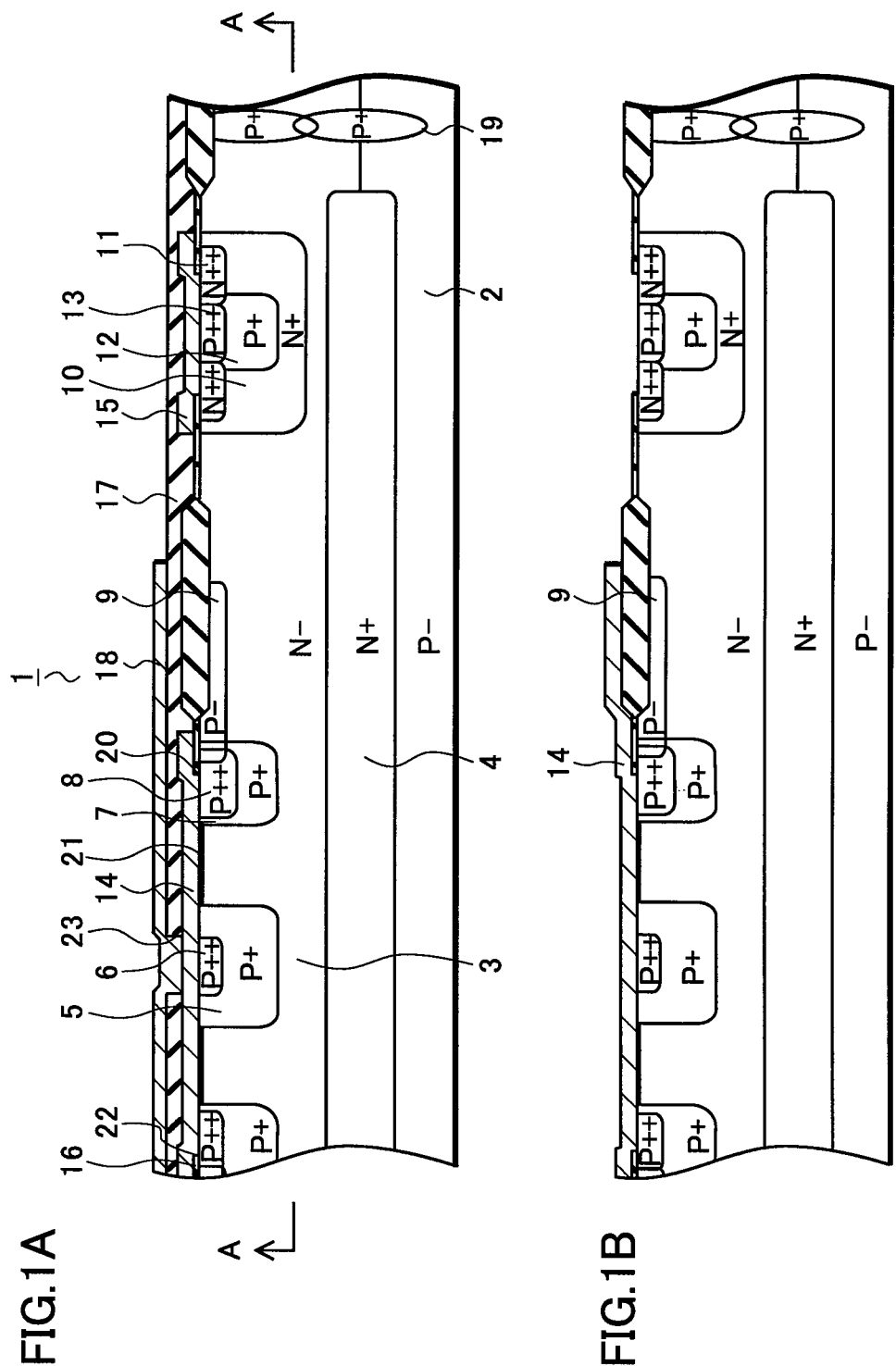

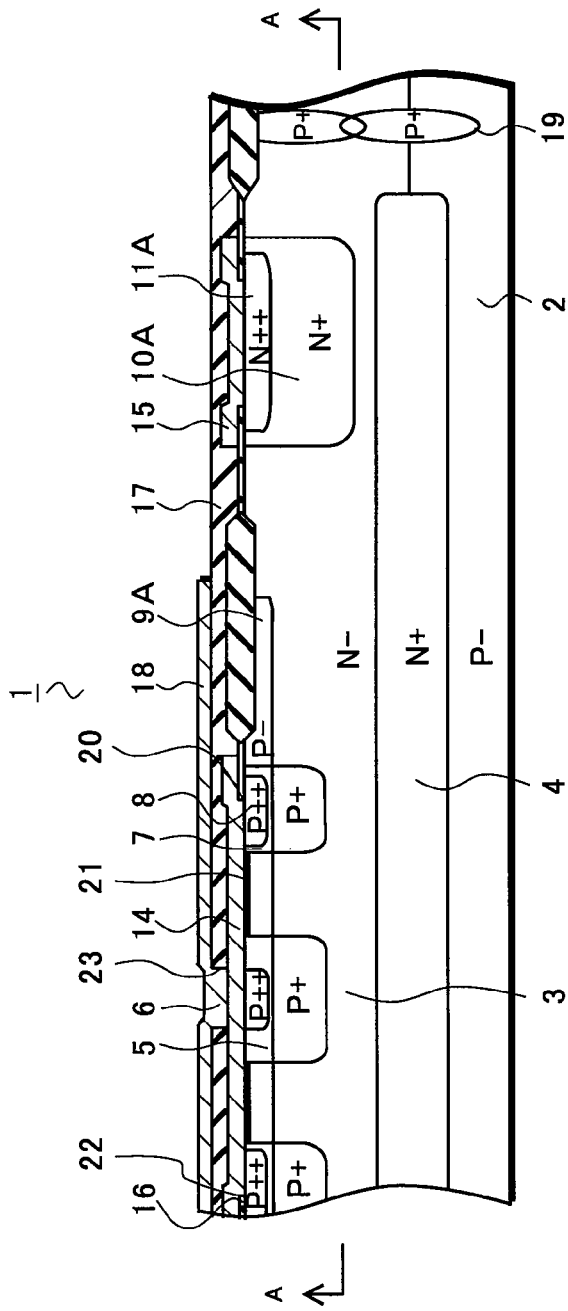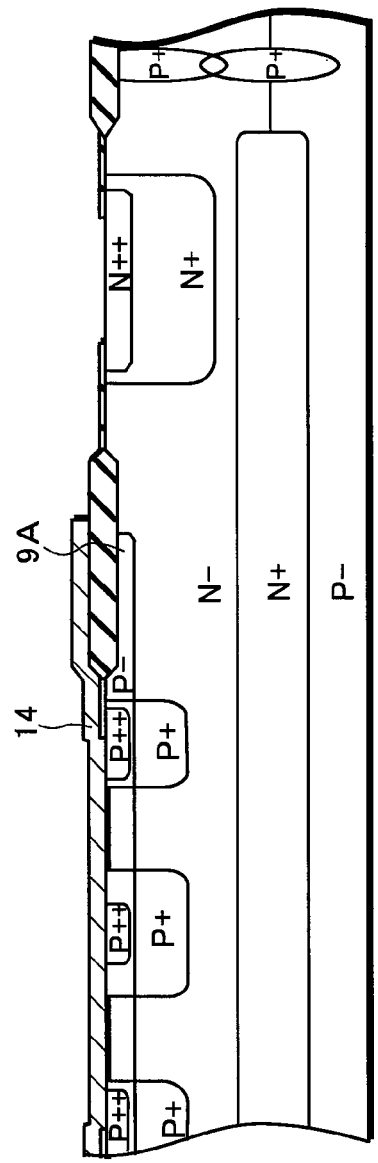
FIG.9A
FIG.9B

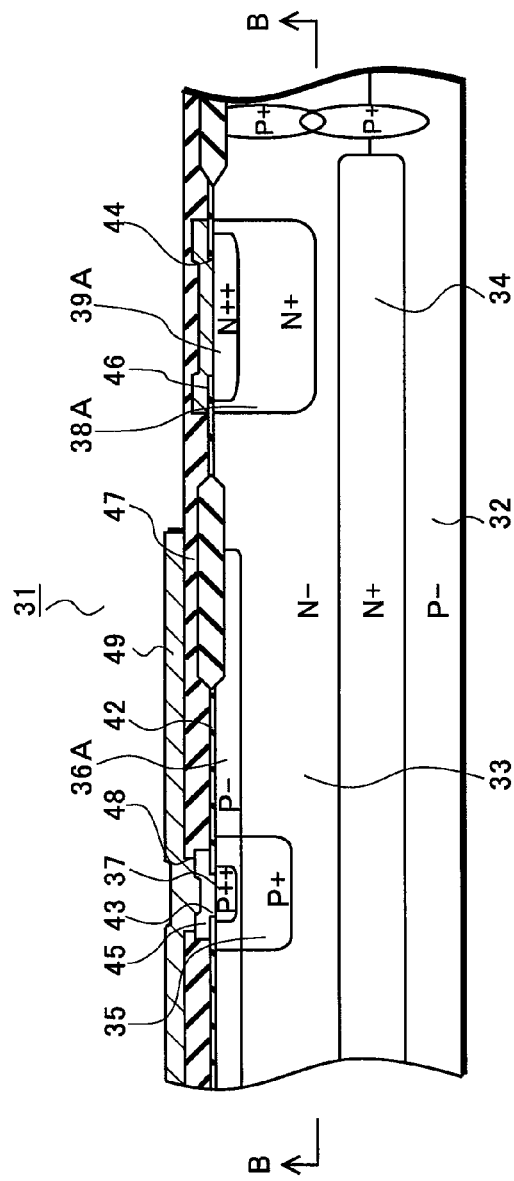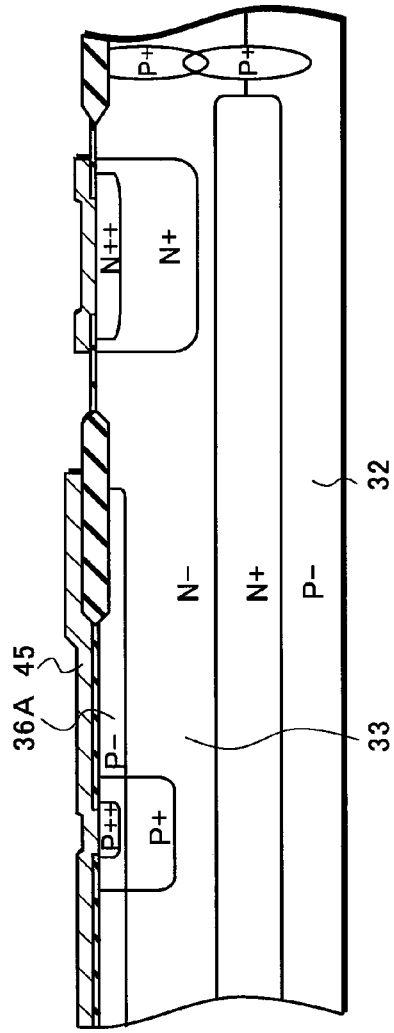
FIG.10A
FIG.10B

SEMICONDUCTOR DEVICE

This application claims priority from Japanese Patent Application Number JP2006-265385, filed Sep. 28, 2006, the content of which is incorporated herein by reference in its entirety.

BACKGROUND OF THE INVENTION

1. Field of the Invention

The present invention relates to a semiconductor device that protects a circuit element from an overvoltage.

2. Description of the Related Art

In a conventional semiconductor device, an N-type epitaxial layer is formed on an N-type semiconductor substrate. A P-type diffusion layer is overlapped onto an N-type diffusion layer formed on the epitaxial layer. Then, an anode electrode is formed on the P-type diffusion layer, and a cathode electrode is formed on a back surface of the substrate to form a Zener diode using a PN junction of both diffusion layers. A P-type guard region is formed around the P-type diffusion layer and another guard region is formed on its outer side. A Schottky barrier metal layer is formed in such a way to come in contact with the epitaxial layer surrounded by both guard regions. Then, a Schottky barrier diode is formed of a silicide of the Schottky barrier metal layer and the epitaxial layer. In the conventional semiconductor device, the Zener diode and the Schottky barrier diode are connected in parallel to achieve a reduction in a forward voltage (Vf) of a device itself. This technology is described for instance in Japanese Patent Application Publication No. Hei 8 (1996)-107222 (Pages 2 to 4, FIG. 1).

In a conventional semiconductor device, P-type diffusion layers with a high impurity concentration are formed on a surface of an N-type semiconductor region and a P-type diffusion layer with a low impurity concentration is formed between the diffusion layers with a high impurity concentration. An electrode formed on the surface of the N-type semiconductor region makes an ohmic contact with the P-type diffusion layer with a high impurity concentration to form a Schottky barrier between the P-type diffusion layer with a high impurity concentration and the P-type diffusion layer with a low impurity concentration. In a forming region where the P-type diffusion layer with a high impurity concentration is formed, a Zener diode is formed using a PN junction. On the other hand, in a forming region where the P-type diffusion layer with a low impurity concentration is formed, a diode, which includes the Zener diode and a Schottky barrier, is formed. This structure decreases free carriers (holes) to be injected into the N-type semiconductor region from the P-type diffusion layer and reduces free carriers (holes) to be stored in the vicinity of the PN junction region. This results in a reduced reverse recovery current density. This technology is described for instance in Japanese Patent Application Publication No. Hei 9 (1997)-121062 (Pages 5-6, FIG. 2).

In a conventional planar type semiconductor device, an anode electrode is formed on a top surface of a P-type semiconductor region formed in an N-type semiconductor region. A conductive field plate, which is connected to the anode electrode, is formed on a top surface of the N-type semiconductor region. Moreover, an equipotential ring electrode and the conductive field plate formed on a top surface of the N-type semiconductor region are connected to each other by a resistive field plate. Then, a thickness of an insulation film which is positioned at a lower portion of a boundary between the conductive field plate and the resistive field plate is thickened, and a thickness of an insulation film, which is positioned at a lower portion of the resistive field plate on the equipotential ring electrode, is thinned. This structure intensifies an effect of the resistive field plate to reduce a curvature of a depletion layer placed at the lower portion of the boundary between the conductive field plate and the resistive field plate. This achieves an improvement in a breakdown voltage characteristic in a region where an electric field concentration is apt to occur. This technology is described for instance in Japanese Patent Application Publication No. Hei 8 (1996)-130317 (Pages 3 to 6, FIGS. 2 and 4).

As mentioned above, according to the conventional semiconductor device, the Zener diode and the Schottky barrier diode are connected in parallel in one device. This structure makes it possible to achieve a low voltage drive by use of a forward voltage (Vf) characteristic of the Schottky barrier diode. However, in the Schottky barrier diode, an epitaxial layer is used as a channel for a main current. This causes a problem in which a parasitic resistance is high in the epitaxial layer, thereby making it impossible to reduce an ON-resistance value.

Moreover, according to the conventional semiconductor device, in the Zener diode, the P-type guard region is formed at a lower portion of an end portion of an anode electrode formed on a top surface of the epitaxial layer. Likewise, in the Schottky barrier diode, the P-type guard region is formed at a lower portion of an end portion of the Schottky barrier metal layer. This structure protects a region where the electric field concentration is apt to occur using the P-type guard region. However, in a structure in which the P-type guard region is formed on an outermost periphery, when a reverse bias is applied, the curvature of the depletion layer is likely to be changed in the vicinity of the end portion of the anode electrode and that of the Schottky barrier metal layer. Particularly, when the above end portion is placed in the vicinity of a termination region of the depletion layer, the change in the curvature of the depletion layer is increased. As a result, there is a problem in which the electric field concentration is apt to occur in the region where the curvature of the depletion layer is changed, thereby making it difficult to achieve a desired breakdown voltage characteristic.

Furthermore, according to the conventional semiconductor device, at a Zener diode operating time, free carriers (holes) which are minority carriers are excessively stored in the N-type epitaxial layer. Then, when the Zener diode is turned off, it is necessary to remove the stored free carriers (holes) from the P-type diffusion layer. At this time, a concentration of the free carriers (holes) in the vicinity of the P-type diffusion layer is high, thereby leading to an increase in an absolute value of a rate of a change of a reverse recovery current in time (di/dt). Accordingly, there is a problem in which a destruction of a protection diode is caused by the rate of change of the reverse recovery current in time (di/dt).

Furthermore, a low forward voltage (Vf) characteristic of the Schottky barrier diode is used to allow the protection diode to operate before the circuit element operates when the overvoltage is applied to the circuit element, thereby preventing the circuit element from being destroyed. In such a case, there is a problem that the forward voltage (Vf) characteristic of the Schottky barrier diode is made too low, for example due to the influence of the Schottky barrier metal layer formed on the surface of the epitaxial layer or due to other reasons, thereby causing an increase in a reverse off-leak current.

Furthermore, the low forward voltage (Vf) characteristic of the Schottky barrier diode is used to allow the protection diode to operate before the circuit element operates when the overvoltage is applied to the circuit element, thereby preventing the circuit element from being destroyed. In such a case, there is a problem that the forward voltage (Vf) characteristic of the Schottky barrier diode is made too low, for example due to the influence of the configuration or the like of the Schottky barrier metal layer formed on the surface of the epitaxial layer, and the like, thereby causing an increase in the reverse off-leak current.

SUMMARY OF THE INVENTION

The present invention provides a semiconductor device that includes first and second anode diffusion layers of opposite conductivity type formed on a semiconductor layer of one conductivity type to be isolated therefrom, a cathode diffusion layer of one conductivity type formed on the semiconductor layer, a third anode diffusion layer of opposite conductivity type formed in the semiconductor layer so as to surround the first and second anode diffusion layers and to extend toward the cathode diffusion layer, and a Schottky barrier metal layer formed on the first to third anode diffusion layers.

Furthermore, in the semiconductor device of the present invention, the cathode diffusion layer is formed of two diffusion layers of one conductivity type having different impurity concentrations, and is connected to a cathode electrode.

Furthermore, in the semiconductor device of the present invention, an impurity concentration of the third anode diffusion layer is lower than those of the first and second anode diffusion layers.

Furthermore, in the semiconductor device of the present invention, an electric field shielding film having an electric potential equal to that of the cathode diffusion layer is formed on the semiconductor layer, and the electric field shielding film is placed in a region where a wiring layer to which an anode potential is applied traverses over the cathode diffusion layer.

BRIEF DESCRIPTION OF THE DRAWINGS

FIG. 1A and FIG. 1B are cross-sectional views each explaining a protection diode according to a preferred embodiment of the present invention.

FIGS. 9A and 9B are cross-sectional views explaining a protection diode according to another preferred embodiment of the present invention.

FIGS. 10A and 10B are cross-sectional views explaining a PN diode according to another preferred embodiment of the present invention.

DETAILED DESCRIPTION OF THE PREFERRED EMBODIMENT

Figures 2A, 2B:
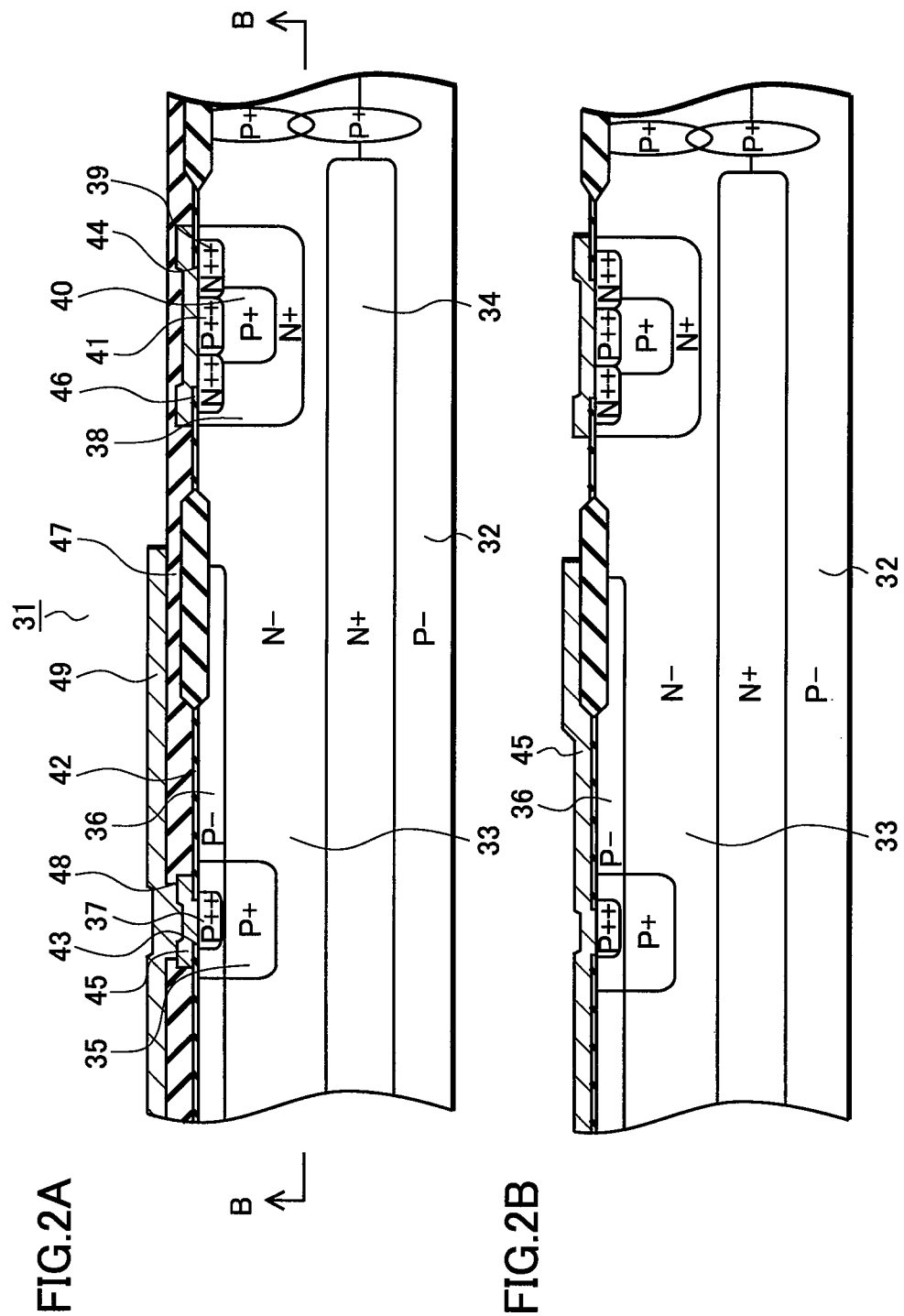
FIG. 2A and FIG. 2B are cross-sectional views each explaining a Zener diode according to the preferred embodiment of the present invention.
Figure 3:
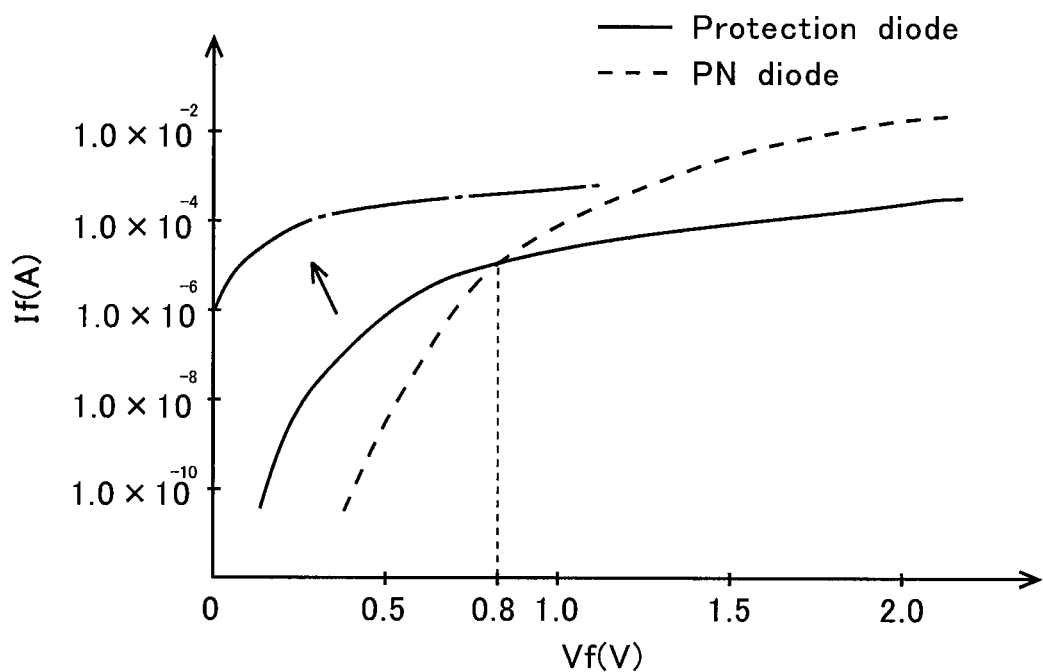
FIG. 3 is a view explaining a forward voltage (Vf) of each of the protection diode and a Zener diode according to the preferred embodiment of the present invention.
Figure 4:
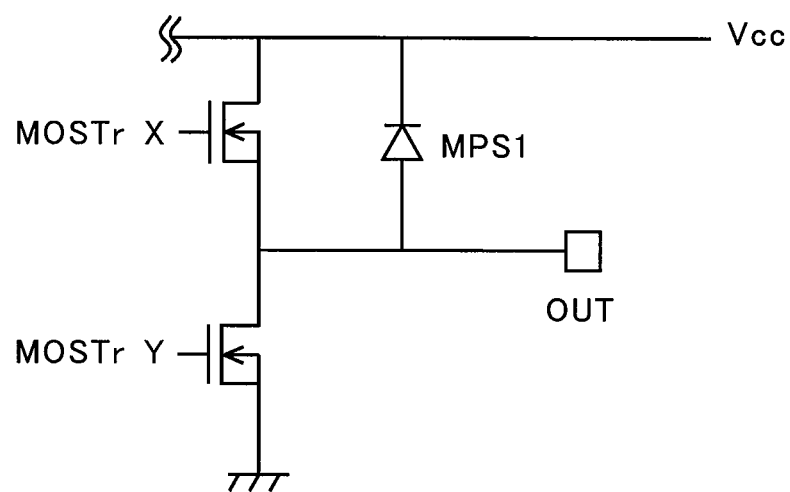
FIG. 4 is a view explaining a circuit into which the protection diode is incorporated according to the preferred embodiment of the present invention.
Figure 5A:
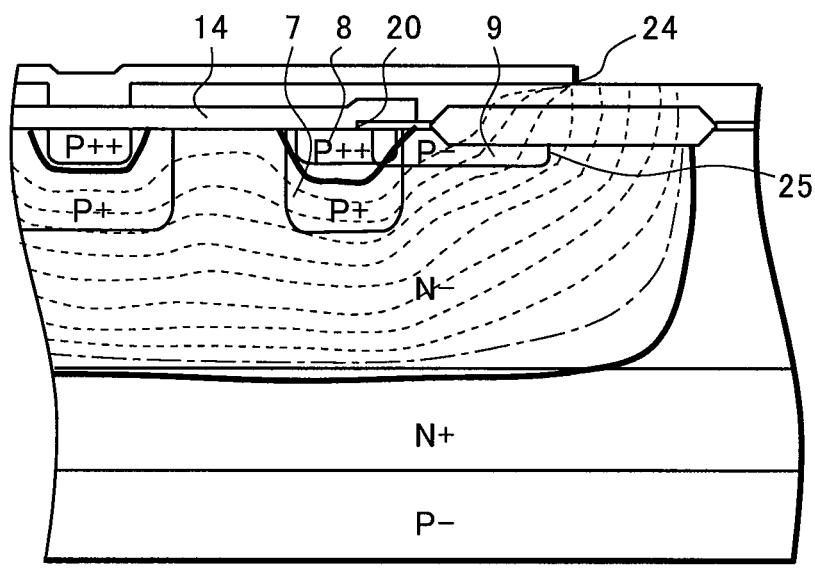
FIG. 5A is a view explaining an electric potential distribution of the protection diode in a reverse bias state according to the embodiment of the present invention, and 5B is a view explaining an impact ionization occurring region in the protection diode according to the preferred embodiment of the present invention.
Figure 5B:
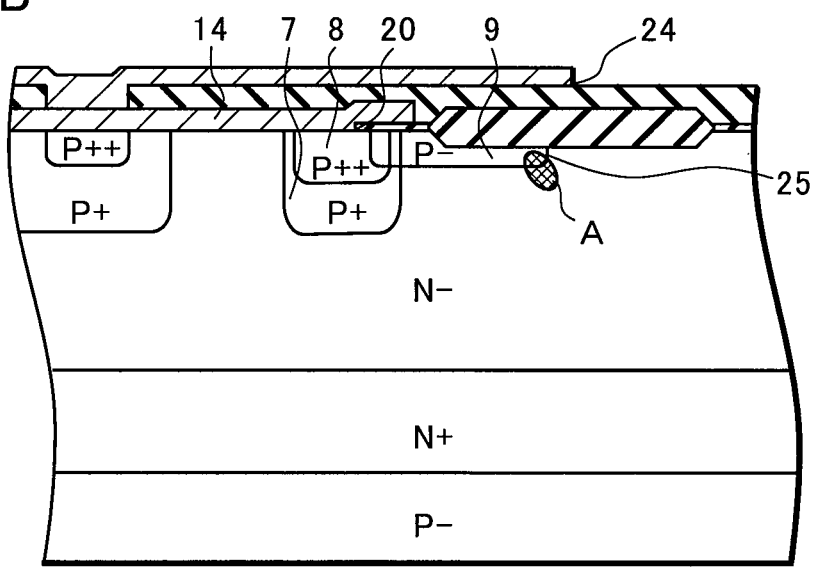
Figure 6:
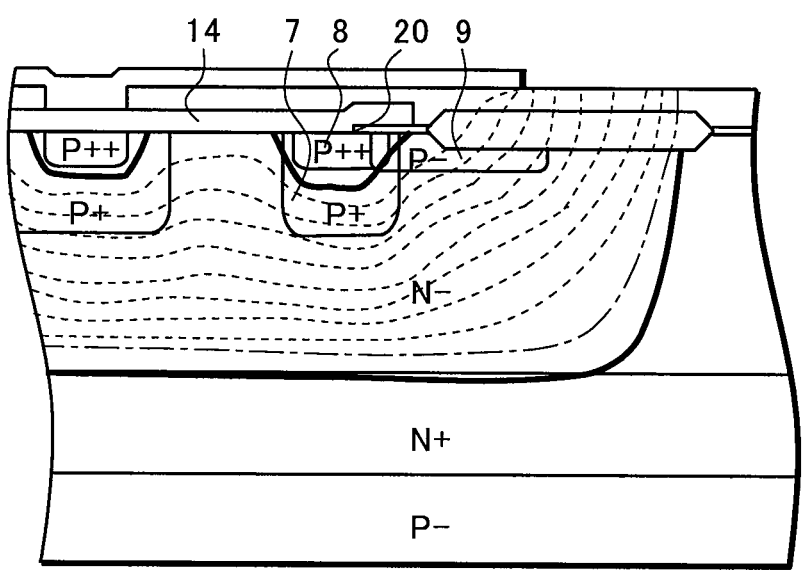
FIG. 6 is a view explaining an electric potential distribution of the protection diode in a reverse bias state according to the preferred embodiment of the present invention.
Figure 7:
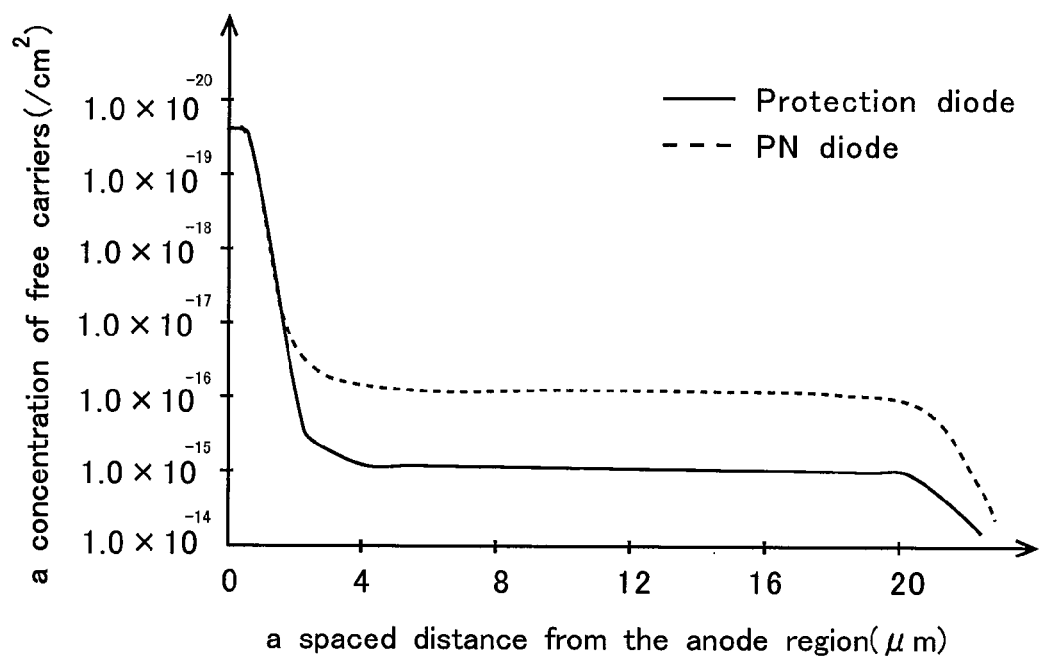
FIG. 7 is a view explaining a concentration profile of free carriers (holes) of each of the protection diode and the Zener diode according to the preferred embodiment of the present invention.
Figure 8:
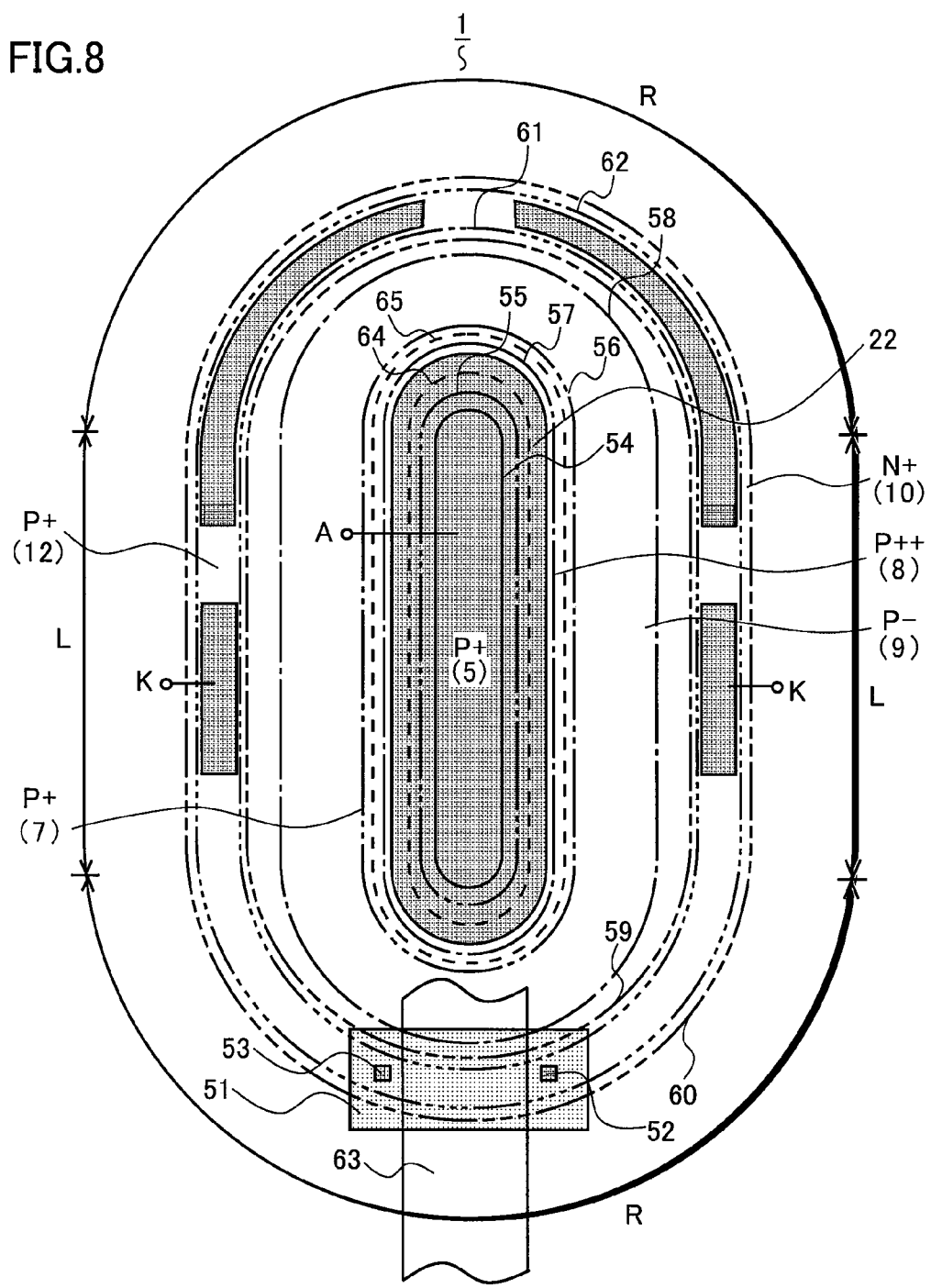
FIG. 8 is a plane view explaining the protection diode according to the preferred embodiment of the present invention.

The following will specifically explain a semiconductor device according to one preferred embodiment of the present invention with reference to FIGS. 1 to 7. FIG. 1A and FIG. 1B are cross-sectional views each explaining a protection diode according to one embodiment of the present invention. FIG. 2A and FIG. 2B are cross-sectional views each explaining a Zener diode according to the embodiment. FIG. 3 is a view explaining a forward voltage (Vf) of each of the protection diode and a Zener diode according to the embodiment. FIG. 4 is a view explaining a circuit into which the protection diode is incorporated according to the embodiment. FIG. 5A is a view explaining an electric potential distribution of the protection diode in a reverse bias state according to the embodiment. FIG. 5B is a view explaining an impact ionization occurring region in the protection diode according to the embodiment. FIG. 6 is a view explaining an electric potential distribution of the protection diode in a reverse bias state according to the embodiment. FIG. 7 is a view explaining a concentration profile of free carriers (holes) of each of the protection diode and the Zener diode according to the embodiment. FIG. 8 is a plane view explaining the protection diode according to the embodiment.

As illustrated in FIG. 1A, a protection diode 1 in which a Zener diode and a Schottky barrier diode are arranged in parallel mainly includes a P-type monocrystalline silicon substrate 2, an N-type epitaxial layer 3, an N-type buried diffusion layer 4, P-type diffusion layers 5, 6, 7, 8, and 9 which are used as an anode region, N-type diffusion layers 10 and 11 which are used as a cathode region, P-type diffusion layers 12, and 13, a Schottky barrier metal layer 14 which is used as an anode electrode, a metal layer 15 which is used as a cathode electrode, insulation layers 16 and 17, and a metal layer 18 connected to the anode electrode. It is noted that conductivity types such as $N^+$, N and $N^-$ belong in one general conductivity type and conductivity types such as $P^+$, P and $P^-$ belong in another general conductivity type.

The N-type epitaxial layer 3 is deposited on a top surface of the P-type monocrystalline silicon substrate 2. It is noted that the epitaxial layer 3 of the present embodiment corresponds to "a semiconductor layer" of the present invention. Then, although the present embodiment shows a case in which one epitaxial layer 3 is formed on the substrate 2, the embodiment of the present invention is not limited to this case. For example, as "the semiconductor layer" of the present invention, a plurality of epitaxial layers may be formed on the top surface of the substrate. Moreover, only the substrate may be used as "the semiconductor layer" of the present invention, and the substrate may include an N-type monocrystalline silicon substrate and a compound semiconductor substrate.

The N-type buried diffusion layer 4 is formed in both regions of the substrate 2 and the epitaxial layer 3. As illustrated in FIG. 1, the N-type buried diffusion layer 4 is formed across a forming region of the protection diode 1 divided by an isolation region 19.

The P-type diffusion layers 5 and 6 are formed in the epitaxial layer 3. The P-type diffusion layer 5 is formed on diffusion conditions that, for example, an impurity concentration of a surface thereof is about $1.0 \times 10^{16}$ to $1.0 \times 10^{17}$ (/cm$^2$) and a diffusion depth is about 5 to 6(μm). The P-type diffusion layer 6 is formed on diffusion conditions that, for example, an impurity concentration of a surface thereof is about $1.0 \times 10^{19}$ to $1.0 \times 10^{20}$ (/cm$^2$) and a diffusion depth is about 1 to 3(μm). Then, the P-type diffusion layer 5 and the N-type epitaxial layer 3 form a PN junction and the P-type diffusion layers 5 and 6 are used as anode regions of the Zener diode. It is noted that this embodiment has the P-type diffusion layers 5 and 6. However, only the P-type diffusion layer 5 or P-type diffusion layer 6 may be used. Furthermore, a triple diffusion structure may be used in which a P-type diffusion layer, having, for example, its surface impurity concentration of about $1.0 \times 10^{17}$ to $1.0 \times 10^{18}$ (/cm$^2$) and a diffusion depth of about 2 to 4(μm), is formed in the P-type diffusion layers 5 and 6.

The P-type diffusion layers 7 and 8 are formed in the epitaxial layer 3 and surround the P-type diffusion layer 5 annularly. The P-type diffusion layer 7 is formed on diffusion conditions that, for example, its surface impurity concentration is about $1.0 \times 10^{16}$ to $1.0 \times 10^{17}$ (/cm$^2$) and a diffusion depth is about 5 to 6(μm). The P-type diffusion layer 8 is formed on diffusion conditions that, for example, its surface impurity concentration is about $1.0 \times 10^{17}$ to $10 \times 10^{18}$ (/cm$^2$) and a diffusion depth is about 2 to 4(μm). Then, the P-type diffusion layer 7 and the N-type epitaxial layer 3 form a PN junction and the P-type diffusion layers 7 and 8 are used as the anode region of a Zener diode. Also, the P-type diffusion layers 7 and 8 are formed below an end portion 20 of the Schottky barrier metal layer 14 which serves as an anode electrode. The P-type diffusion layer 8, which has a higher impurity concentration than that of the P-type diffusion layer 7, is formed to be overlapped thereon. It is noted that this embodiment has the P-type diffusion layers 7 and 8. However, only one of the P-type diffusion layer 7 and the P-type diffusion layer 8 may be used. Also, a multi-diffusion structure such as the triple diffusion structure and the like may be used.

The P-type diffusion layer 9 is formed to surround the P-type diffusion layer 5 annularly, and a part of the forming regions thereof is overlapped on the P-type diffusion layers 7 and 8. The P-type diffusion layer 9 is formed on diffusion conditions that, for example, its surface impurity concentration is about $1.0 \times 10^{15}$ to $1.0 \times 10^{16}$ (/cm$^2$) and a diffusion depth is about 1 to 3(μm). Then, the P-type diffusion layer 9 is formed and is extended toward the N-type diffusion layer 10 more than the P-type diffusion layers 7 and 8. Then, the impurity concentration of the P-type diffusion layer 9 is lower than that of each of the P-type diffusion layers 7 and 8.

Also, in the epitaxial layer 3, the N-type diffusion layers 10 and 11 are formed to surround the P-type diffusion layer 5 annularly. The N-type diffusion layers 10 and 11 and the N-type epitaxial layer 3 are used as the cathode region of the Zener diode and the Schottky barrier diode. Then, a wide diffusion region is formed as the N-type diffusion layer 10, thereby reducing a parasitic capacitance value. On the other hand, although the N-type diffusion layer 11 is a narrow diffusion layer, the N-type diffusion layer 11 has a high impurity concentration, thereby improving a reduction in resistance. It is noted that the N-type diffusion layers 10 and 11 can be used as a cathode diffusion layer. However, at least one of the N-type diffusion layer 10 and N-type diffusion layer 11 can be used as the cathode diffusion layer. Also, the multi-diffusion structure such as the triple diffusion structure and the like can be used.

The P-type diffusion layers 12 and 13 are formed in the N-type diffusion layer 10, and their forming regions are overlapped on each other. The P-type diffusion layers 12 and 13 are formed to surround the P-type diffusion layer 5 annularly. The P-type diffusion layer 12 is formed on diffusion conditions that, for example, its surface impurity concentration is about $1.0 \times 10^{16}$ to $1.0 \times 10^{17}$ (/cm$^2$) and a diffusion depth is about 5 to 6(μm). The P-type diffusion layer 13 is formed on diffusion conditions that, for example, its surface impurity concentration is about $1.0 \times 10^{19}$ to $1.0 \times 10^{20}$ (/cm$^2$) and a diffusion depth is about 1 to 3(μm). Then, the metal layer 15, which is used as a cathode electrode, is in contact with the N-type diffusion layer 11 and the P-type diffusion layer 13. With this structure, the P-type diffusion layers 12 and 13 are formed to have electric potentials equal to that of the N-type diffusion layers 10 and 11. It is noted that the P-type diffusion layers 12 and 13 can be used a discharge diffusion layer. However, at least one of the P-type diffusion layer 12 and P-type diffusion layer 13 can be used as the discharge diffusion layer. Also, the multi-diffusion structure such as the triple diffusion structure and the like can be used.

The Schottky barrier metal layer 14 is formed on the top surface of the epitaxial layer 3. The Schottky barrier metal layer 14 is formed, for example, by depositing an aluminum alloy (for example an aluminum silicon (AlSi) layer, an aluminum copper (AlCu) layer or an aluminum silicon copper (AlSiCu) layer) on a titanium (Ti) layer and a titanium nitride (TiN) layer serving as the barrier metal layer. As shown by a thick line, a silicide layer 21 of a titanium silicide (TiSi$_2$) is formed on the surface of the epitaxial layer 3 positioned between the P-type diffusion layer 5 and the P-type diffusion layer 7. Then, a Schottky barrier diode is formed of the silicide layer 21 of the Schottky barrier metal layer 14, and the epitaxial layer 3. It is noted that metals such as tungsten (W), molybdenum (Mo), tantalum (Ta), cobalt (Co), nickel (Ni), and platinum (Pt) may be used in place of the titanium (Ti) layer. In this case, a tungsten silicide (WSi$_2$) layer, a molybdenum silicide (MoSi$_2$) layer, a cobalt silicide (CoSi$_2$) layer, a nickel silicide (NiSi$_2$) layer, a platinum silicide (PtSi$_2$) layer are formed as a silicide layer 21.

The metal layer 15 is formed on the top surface of the epitaxial layer 3. The metal layer 15 has a structure in which the aluminum alloy (for example the aluminum silicon (AlSi) layer, the aluminum copper (AlCu) layer or the aluminum silicon copper (AlSiCu) layer) is layered on the barrier metal layer. Then, the metal layer 15 is used as a cathode electrode and a cathode potential is applied to the N-type diffusion layer 8 and the P-type diffusion layer 13.

The insulation layers 16 and 17 are formed on the upper portion of the epitaxial layer 3. The insulation layers 16 and 17 are formed by selectively layering, for example, a silicon oxide film, a silicon nitride film, a TEOS (Tetra-Ethyl-Orso-Silicate) film, a BPSG (Boron Phospho Silicate Glass) film, an SOG (Spin On Glass) film, and the like. A contact hole 22 is formed on the insulation film 16. The contact hole 22 is filled with the Schottky barrier metal layer 14 and the Schottky barrier metal layer 14 is used as an anode electrode.

The metal layer 18 is formed on a top surface of the insulation layer 17, and covers a region above the forming region of the P-type diffusion layer 9. The metal layer 18 has a structure in which the aluminum alloy (for example the aluminum silicon (AlSi) layer, the aluminum copper (AlCu) layer or the aluminum silicon copper (AlSiCu) layer) is layered on the barrier metal layer. The metal layer 18 fills a contact hole 23 which is formed in the insulation layer 17, and is connected to the Schottky barrier metal layer 14. With this structure, when the reverse bias is applied to the protection diode 1, the metal layer 18 is used as a field plate, thereby improving a breakdown voltage characteristic of the protection diode 1.

Additionally, in the present embodiment, as illustrated in FIG. 1B, the Schottky barrier metal layer 14 may be formed and covers a region above the forming region of the P-type diffusion layer 9 as in the metal layer 18 illustrated in FIG. 1A. In this case, when the reverse bias is applied to the protection diode 1, the Schottky barrier metal layer 14 is used as a field plate, thereby improving the breakdown voltage characteristic of the protection diode 1.

FIG. 2A illustrates a Zener diode 31. It is noted that the Zener diode has substantially the same breakdown voltage characteristic as that of the protection diode 1 shown in FIG. 1. The following will explain the structure.

An N-type epitaxial layer 33 is deposited on a top surface of a P-type monocrystalline silicon substrate 32. An N-type buried diffusion layer 34 is formed in both regions of the substrate 32 and the epitaxial layer 33. P-type diffusion layers 35, 36, and 37 are formed in the epitaxial layer 33. The P-type diffusion layers 35, 36 and the N-type epitaxial layer 33 form a PN junction region and the P-type diffusion layers 35, 36 and 37 are used as an anode region of the Zener diode.

N-type diffusion layers 38 and 39 are formed in the epitaxial layer 33. The N-type diffusion layers 38 and 39 and the N-type epitaxial layer 33 are used as cathode regions of the Zener diode. Then, P-type diffusion layers 40 and 41 are formed in the N-type diffusion layer 38.

An insulation layer 42 is formed on a top surface of the epitaxial layer 33 and contact holes 43 and 44 are formed in the insulation layer 42. A metal layer 45 is connected to the P-type diffusion layer 37 through the contact hole 43 and is used as an anode electrode. A metal layer 46 is connected to the N-type diffusion layer 39 and the P-type diffusion layer 41 through the contact hole 44 and is used as a cathode electrode.

An insulation layer 47 is formed on the insulation layer 42 and a contact hole 48 is formed in the insulation film 47. A metal layer 49 is connected to the metal layer 45 through the contact hole 48. Also, the metal layer 49 is formed to cover a region above a forming region of the P-type diffusion layer 36 and provides a field plate effect.

Additionally, in the present embodiment, as illustrated FIG. 2B, the metal layer 45 may be formed to cover a region above the forming region of the P-type diffusion layer 36 as in the metal layer 49 shown in FIG. 2A.

Next, in FIG. 3, a forward voltage (Vf) of the protection diode 1 is shown by a solid line and a forward voltage (Vf) of the PN diode 31 by a doted line.

As described using FIG. 1, in the protection diode 1, the PN diode and the Schottky barrier diode are arranged in parallel. It is shown from this structure that the forward current (If) of the protection diode 1 is higher than that of the PN diode 31 and has an excellent current capability when Vf is, for example, 0.8 (V) or less. On the other hand, it is shown that the protection diode 1 is driven at a lower electric potential than that of the Zener diode 31, when If is, for example, $1.0 \times 10^{-8}$ (A). Namely, by this device characteristic, a MOS transistor connected to an output terminal, and the protection diode 1 are connected in parallel, thereby making it possible to protect the MOS transistor from an overvoltage generated at an electric discharge in a cathode ray tube or at a turn-off of L load such as a motor load.

More specifically, FIG. 4 shows a circuit in which N-channel type MOS transistors X and Y are connected in series between a power supply line (Vcc) and a ground (GND), and a source electrode of the MOS transistor X and a drain electrode of the MOS transistor Y are connected to an output terminal.

The following will explain a case in which an overvoltage is applied to an output terminal of a circuit where the protection diode 1 is not connected between the power supply line (Vcc) and the output terminal. A forward bias is applied by the overvoltage between the source and drain of the MOS transistor X where the reverse bias is applied. At this time, a current more than an allowed value flows between the source and the drain, accordingly, the PN junction region is destroyed and the MOS transistor X is destroyed.

However, in the present embodiment, the protection diode 1 and the MOS transistor X are connected in parallel between the power supply line (Vcc) and the output terminal. In this case, as explained using FIG. 3, when the overvoltage is applied to the output terminal, the protection diode 1 is first operated and almost all current generated by the overvoltage can be let out to the power supply line (Vcc) by the protection diode 1. This results that the current flowing between the source and the drain of the MOS transistor X is reduced, accordingly, it is possible to prevent the PN junction region from being destroyed.

Next, in FIG. 5A, a thick solid line shows an end region of the depletion layer, a dotted line shows an equipotential line, and a dashed-dotted line shows an equipotential line of 318 (V). The P-type diffusion layers 7 and 8 are formed at the lower portion of the end portion 20 of the Schottky barrier metal layer 14 in a double diffusion structure. Then, a region where the P-type diffusion layers 7 and 8 are overlapped on each other is a high impurity concentration region, and the region includes a part which is not depleted as illustrated by a solid line. As a result, the distance between the equipotential lines is not reduced at the lower portion of the Schottky barrier metal layer 14, accordingly, an electric field concentration is hard to occur. In other words, the electric field concentration on the end portion 20 of the Schottky barrier metal layer 14 is relaxed, thereby making it possible to improve the breakdown voltage characteristic of the protection diode 1.

Moreover, the P-type diffusion layer 9 is connected to the P-type diffusion layers 7 and 8, and the P-type diffusion layer 7 is extended to the cathode electrode. The P-type diffusion layer 9 has the low impurity concentration and is filled with the depletion layer as illustrated in FIG. 5A. Then, in the region where the P-type diffusion layer 9 is formed, the distance between the equipotential lines is gradually changed. In other words, the P-type diffusion layer 9, which is filed with the depletion layer, is formed on an outermost periphery from the anode electrode. This structure reduces the change in the curvature of the depletion layer in the termination region thereof, and improves the breakdown voltage characteristic of the protection diode 1 as illustrated in FIG. 5A. As a result, it is possible to improve a problem on the deterioration of the breakdown voltage characteristic by forming the Schottky barrier diode, therefore the Schottky barrier diode can be driven at a low forward voltage (Vf).

Furthermore, the metal layer 18 is extended toward the cathode electrode more than the P-type diffusion layer 9. As illustrated in FIG. 5A, with the field plate effect by the metal layer 18 to which the anode potential is applied, some equipotential lines are displaced to converge onto an end portion 24 of the metal layer 18. As a result, the equipotential lines concentrate on the lower portion of the end portion 24 of the metal layer 18, and the electric field concentration is apt to occur. As illustrated in FIG. 5B, the impact ionization A occurs in the vicinity of an end portion 25 of the P-type diffusion layer 9 placed at the cathode electrode. It is shown in FIG. 5B that the formation of the P-type diffusion layers 7 and 8 prevents the deterioration of the breakdown voltage characteristic at the end portion 20 of the Schottky barrier metal layer 14 where the electric field concentration is apt to occur.

FIG. 6 illustrates an electric potential distribution when the position of the end portion 24 of the metal layer 18 is changed to the upper surface of the P-type diffusion layer 9 from the reverse bias state of FIG. 5A. A thick solid line shows the end region of the depletion layer, a dotted line shows the equipotential line, and a dashed-dotted line shows the equipotential line of 279 (V). As illustrated in FIG. 6, with the field plate effect by the metal layer 18 to which the anode potential is applied, some equipotential lines are displaced to converge onto the end portion 24 of the metal layer 18. In this case, the end portion 24 of the metal layer 18 is positioned in the anode electrode, thereby suppressing the expansion of the depletion layer. As a result, it is shown that the breakdown voltage characteristic of the protection diode is degraded as compared with the case of FIG. 5A.

It is noted that the present embodiment has explained the case in which the metal layer 18, serving as the field plate, is extended toward the cathode electrode more than the P-type diffusion layer 9. However, the embodiment of the present invention is not limited to this case. Regarding the relationship in a position between the end portion 24 of the metal layer 18 and the end portion 25 of the P-type diffusion layer 9, design changes may be arbitrarily made depending on an impurity concentration and a diffusion depth of the P-type diffusion layer 9, and a thickness of the insulation film placed at the lower portion of the metal layer 18. For example, there is a case in which the impurity concentration of the P-type diffusion layer 9 is higher than that of the present embodiment under the same condition of the diffusion depth of the P-type diffusion layer 9 and the thickness of the insulation film placed at the lower portion of the metal layer 18. In this case, the end portion 24 of the metal layer 18 is structured to be extended toward the cathode electrode more than the end portion 25 of the P-type diffusion layer 9. This structure intensifies an influence of the electric field originating from the metal layer 18, and makes it possible to improve the breakdown voltage characteristic of the protection diode 1. On the other hand, there is a case in which the impurity concentration of the P-type diffusion layer 9 is lower than that of the present embodiment. In this case, the end portion 25 of the P-type diffusion layer 9 is structured to be extended toward the cathode electrode more than the end portion 24 of the metal layer 18. This structure intensifies the influence of the electric field originating from the metal layer 18, and makes it possible to improve the breakdown voltage characteristic of the protection diode 1.

Next, in FIG. 7, a solid line shows a concentration profile of free carriers (holes) of the protection diode 1 at a cross section taken along a line A-A (FIG. 1A) and a dotted line shows a concentration profile of free carriers (holes) of the Zener diode 31 at a cross section taken along a line B-B (FIG. 2A). It is noted that a longitudinal axis shows a concentration of free carriers (holes) in the epitaxial layer, and a horizontal axis shows a spaced distance from the anode region. Then, FIG. 7 shows the concentration profiles in a state that Vf=0.8 (V) is applied to the protection diode 1 and the Zener diode 31, respectively.

First, as illustrated in FIG. 1, at the time of operating the protection diode 1, the forward voltage (Vf) is applied to the PN junction region of the P-type diffusion layer 5 and the N-type epitaxial layer 3, and the free carriers (holes) are implanted into the epitaxial layer 3 from the P-type diffusion layer 5. On the other hand, as illustrated in FIG. 2, at the time of operating the Zener diode 31, the forward voltage (Vf) is applied to the PN junction region of the P-type diffusion layer 34 and the N-type epitaxial layer 33, and the free carriers (holes) are implanted into the epitaxial layer 33 from the P-type diffusion layer 34. Namely, both the protection diode 1 and the Zener diode 31 have substantially equal concentration of the free carriers (holes) in the region close to the P-type diffusion layers 5 and 34.

Next, as illustrated in FIG. 1, in the protection diode 1, the Schottky barrier diode is formed, therefore the P-type diffusion layers 7, 8, and 9 are formed to be isolated from the P-type diffusion layer 5. This structure reduces the PN junction region to which the forward voltage (Vf) is applied and decreases the free carriers (holes) to be implanted into the N-type epitaxial layer 3. As a result, in the protection diode 1, the concentration of free carriers (holes) is reduced in the region isolated from the P-type diffusion layer 5 as compared with that of the Zener diode 31. Additionally, in the epitaxial layer 3, the free carriers (holes) are distributed and cause a conductivity modulation, accordingly, the main current flows with a low ON resistance. This can solve the problem of the Schottky barrier diode in which the ON-resistance value is high.

Finally, as illustrated in FIG. 1, the cathode region of the protection diode 1 is formed and has a double diffusion structure of the N-type diffusion layers 10 and 11. With this structure, the free carriers (holes) implanted from the P-type diffusion layer 5 are recombined with free carriers (electrons) implanted from the N-type diffusion layers 10 and 11 in a region close to the N-type diffusion layer 10. At this time, the N-type diffusion layer 10 is widely diffused, thereby making it possible to promote the recombination.

Furthermore, in the protection diode 1, the P-type diffusion layers 12 and 13 to which the cathode potential is applied are formed in the N-type diffusion layer 10. Then, the free carriers (holes) which reached the P-type diffusion layers 12 and 13 and are not recombined, are discharged from the P-type diffusion layers 12 and 13 to the outside of the epitaxial layer 3. As a result, the concentration of the free carriers (holes) in the region close to the cathode region can be largely reduced and the free carriers (holes) in the epitaxial layer 3 can be also reduced. On the other hand, as illustrated in FIG. 2, the cathode region of the Zener diode 31 also has the same structure and the concentration of the free carriers (holes) in the region close to the cathode region is largely reduced.

As mentioned above, in the protection diode 1, the Schottky barrier diode is formed and the cathode region where the free carriers (holes) are apt to be discharged from the epitaxial layer 3 is formed. This structure can reduce the concentration of the free carriers (holes) stored in the vicinity of the PN junction region of the protection diode 1. As a result, when the protection diode 1 is turned off, an absolute value of a rate of a change of a reverse recovery current in time (di/dt) is reduced, thereby making it possible to obtain a soft recovery characteristic. Moreover, it is possible to prevent the destruction of the protection diode 1 caused by the rate of the change of the reverse recovery current in time (di/dt).

Next, as illustrated in FIG. 8, the protection diode 1 is formed in, for example, an elliptical shape. In a linear region L of the elliptical shape, the P-type diffusion layer 5 (a region surrounded by a solid line 54), which is used as an anode region, is placed in a central region. Then, in the linear region L and a round region R of the elliptical shape, the P-type diffusion layers 7 (a region surrounded by a two-dot chain line 55, 56) and 8 (a region surrounded by a dotted line 64, 65) are formed in an annular shape to surround the P-type diffusion layer 5. As mentioned above, the P-type diffusion layers 7 and 8 relax the electric field concentration on the end portion 20 (FIG. 1) of the Schottky barrier metal layer 14 (FIG. 1), thereby improving the breakdown voltage characteristic of the protection diode 1.

In the linear region L and the round region R of the elliptical shape, the P-type diffusion layer 9 (a region surrounded by a dashed-dotted line 57, 58) is formed in an annular shape and surrounds the P-type diffusion layers 7 and 8.

Also, in the linear region L and the round region R of the elliptical shape, the N-type diffusion layer 10, serving as the cathode region, (a region surrounded by a three-dot chain line 59, 60) is formed in an annular shape and surrounds the P-type diffusion layer 9. Then, in the region where the N-type diffusion layer 10 is formed, the P-type diffusion layer 12 (a region surrounded by a four-dot chain line 61, 62) is formed in an annular shape and the forming region thereof is overlapped on the N-type diffusion layer 10. Additionally, although not illustrated, in the P-type diffusion region 5, the P-type diffusion layer 6 (FIG. 1) is formed and the forming region thereof is overlapped on the P-type diffusion layer 5. Also, in the N-type diffusion region 10, the N-type diffusion layer 11 (FIG. 1) and the P-type diffusion layer 13 (FIG. 1) are formed and the forming regions thereof are overlapped on the N-type diffusion layer 10.

With this structure, the protection diode 1 can cause a current to flow in the linear region L and the round region R of the elliptical shape, thereby improving the current capability. Further, in the round region R of the elliptical shape, the round shape and the P-type diffusion layers 7 and 8 relax the electric field concentration and make it possible to improve the breakdown voltage characteristic of the protection diode 1. Furthermore, the elliptical shape of the protection diode 1 allows a device size to be reduced.

The contact hole 22 (FIG. 1) is formed and provided an opening from the P-type diffusion layer 5 to parts of the P-type diffusion layers 7 and 8. The Schottky barrier metal layer 14 is connected to the P-type diffusion layer 5, the N-type epitaxial layer 3 (FIG. 1) and the P-type diffusion layers 7 and 8 through the contact hole 22. As mentioned above, the Schottky barrier metal layer 14 is directly formed on the top surface of the epitaxial layer 3. Then, the Schottky barrier metal layer 14 is formed to keep flatness over the wide region in the contact hole 22. With this structure, the contact hole 23 is formed on the surface directly above the Schottky barrier metal layer 14, through which the metal layer 18 is connected to the Schottky barrier metal layer 14. In other words, the contact hole 23 is formed on the contact hole 22 (FIG. 1) which is for the Schottky barrier metal layer 14. As a result, it is possible to prevent wiring from being routed to the Schottky barrier metal layer 14, and to reduce a wiring pattern area. Additionally, in the explanation of FIG. 8, the same reference numerals as those of FIG. 1 are used for the same structural elements as those of FIG. 1, and the reference numerals are parenthesized in FIG. 8. In FIG. 8, the shaded area in the center shows the position of the contact hole for the anode, and the shaded area covering the anode from the sides and the top shows the position of the contact hole for the cathode.

Finally, in the round region R of the elliptical shape, an electric field shielding film 51 is formed in a region which is placed at a lower portion of a wiring layer 63 applied with an anode potential, and in which the wiring layer at least applied with the anode potential and the N-type cathode diffusion layer 10 cross each other. The electric field shielding film 51 is formed in a process shared with a process for forming a gate electrode of a MOS transistor (not shown) and made of a polysilicon film, for example. Then, the electric field shielding film 51 is connected to the diffusion layers serving as the cathode region, through contact holes 52 and 53 formed in an insulation layer between the epitaxial layer 3 and the electric field shielding film 51. Namely, an electric potential substantially equal to that of the cathode potential is applied to the electric field shielding film 51. With this structure, the electric field shielding film 51 has a shield effect to the wiring layer to which the anode potential is applied. Then, an electric potential of the cathode region is reversed by an electric potential difference between the cathode potential and the anode potential, thereby making it possible to prevent the anode region and the isolation region 19 (FIG. 1) from being short-circuited.

It is noted that the present embodiment has explained the case in which the silicide layer 21 is formed between the P-type diffusion layer 5 serving as the anode region, and the P type diffusion layer 7 serving as the anode region. However, the embodiment of the present invention is not limited to this case. For example, in order to improve the forward voltage (Vf) characteristic of the Schottky barrier diode in the protection diode, there is a case in which the space between the P-type diffusion layer 5 and the P-type diffusion layer 7 is increased and the silicide layer 21 is formed over a wide region. In this case, new P-type diffusion layers to which the anode potential is applied may be formed between the P-type diffusion layer 5 and the P-type diffusion layer 7 at substantially constant intervals. This makes it possible to reduce the change in the curvature of the depletion layer in the forming region of the silicide layer 21 and to maintain the breakdown voltage characteristic of the protection diode.

Also, the P-type diffusion layer 5 may be structured to be diffused deeper than the P-type diffusion layer 7. When the P-type diffusion layer 5 is diffused deeper than the P-type diffusion layer 7, a bottom surface of the P-type diffusion layer 5 is largely separated away from the surface of the epitaxial layer 3 in a vertical direction. Then, the depletion layer expanding from the boundary of the P-type diffusion layer 5 and the epitaxial layer 3 expands to a wide region in a horizontal direction. This results that the spaced distance between the P-type diffusion layer 5 and the P-type diffusion layer 7 can be increased, thereby making it possible to expand the forming region of the silicide layer 21. This allows an improvement of the current capability of the Schottky diode without increasing the P-type diffusion layer connected to the anode electrode. In addition, various modifications can be made without departing from the scope of the embodiment of the present invention.

Figure 11A:
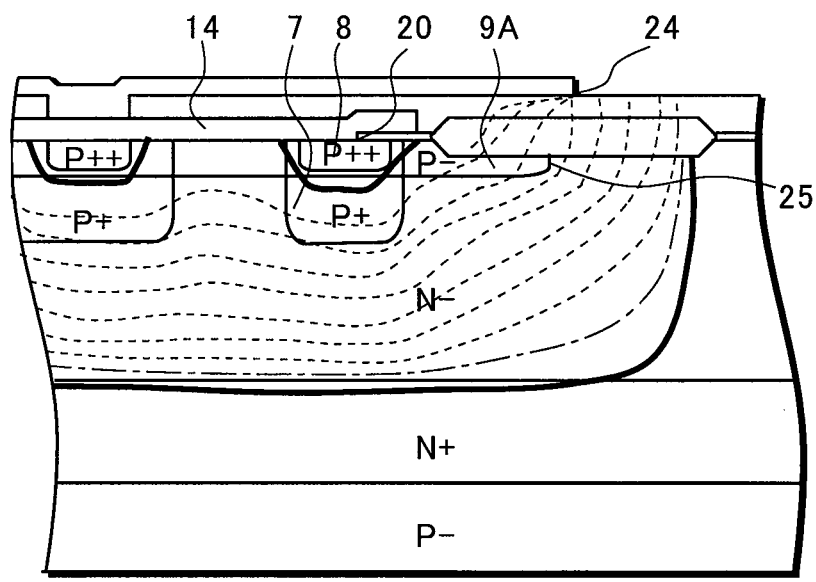
FIG. 11A is a view explaining an electric potential distribution of the protection diode in a reverse bias state according to another preferred embodiment of the present invention.
Figure 11B:
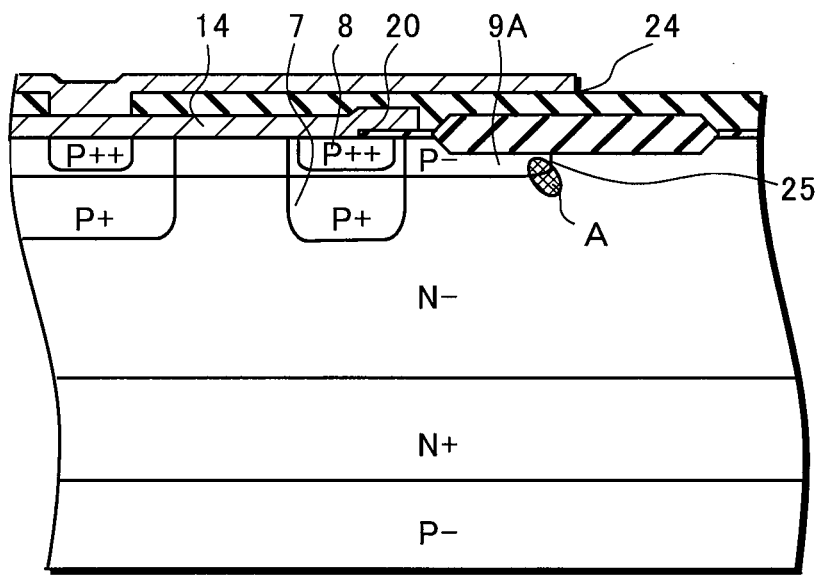
FIG. 11B is a view explaining an impact ionization occurring region in the protection diode according to the another preferred embodiment of the present invention.

Next, with reference to FIGS. 9 to 11, another embodiment of the present invention will be described. Note that, in order to avoid redundant description, the same constituent components as those in the above embodiment will be denoted by the same reference numerals and description thereof will be omitted.

Here, the semiconductor device of the embodiment and a semiconductor device of the another embodiment are different from each other in the configuration of the P-type diffusion layer 9A on the anode side and in the configurations of the N-type diffusion layers 10A and 11A on the cathode side.

Specifically, in the semiconductor device of the embodiment, the P-type diffusion layer 9 (FIG. 1) is formed at a position spaced apart from the P-type diffusion layer 5. Thus, the low forward voltage (Vf) characteristic of the Schottky barrier diode is used to allow the protection diode to operate before the circuit element operates when the overvoltage is applied to the circuit element, thereby preventing the circuit element from being destroyed. However, there is a case where the forward voltage (Vf) characteristic of the Schottky barrier diode is made too low, for example, under the influence of the configuration of the Schottky barrier metal layer 14 formed on the surface of the epitaxial layer 3, and the like, thereby causing an increase in the reverse off-leak current.

This means a case where, in the characteristic diagram shown in FIG. 3, for example, the solid curve representing the protection diode is moved in the arrow direction and the forward voltage (Vf) characteristic is lowered as indicated by the dashed line, thereby causing an increase in the reverse off-leak current.

In such a case, by forming a P-type diffusion layer 9A so as to surround the P-type diffusion layer 5 as shown in FIGS. 9A and 9B, the forward voltage (Vf) characteristic can be prevented from becoming too low. Thus, a problem that the reverse off-leak current becomes too large is solved.

Moreover, as to the N-type diffusion layers 10A and 11A on the cathode side, the P-type diffusion layers 12 (FIG. 1) and 13 (FIG. 1) are provided in the N-type diffusion layer 10 (FIG. 1). However, in order to improve the breakdown voltage in the high-temperature operation, the configurations of the P-type diffusion layers 12 (FIG. 1) and 13 (FIG. 1) are omitted. Here, only either the N-type diffusion layer 10A or the N-type diffusion layer 11A may be used. Alternatively, a multi-diffusion structure such as a triple diffusion structure may be used.

Specifically, although there is no problem in the operation at room temperature, it is possible to avoid a risk that the presence of the P-type diffusion layers 12 (FIG. 1) and 13 (FIG. 1) may induce destruction by causing a BiP operation in this region in the case of the operation at a high temperature (for example, 100 to 150° C.).

According to the present invention, the low forward voltage (Vf) characteristic of the Schottky barrier diode is used to allow the protection diode to operate before the circuit element operates when the overvoltage is applied to the circuit element, thereby making it possible to prevent the circuit element from being destroyed.

The third anode diffusion layer having the impurity concentration lower than that of the first and second anode diffusion layers of opposite conductivity type formed in the semiconductor layer of one conductivity type is formed so as to surround the first and second anode diffusion layers. Thus, the forward voltage (Vf) characteristic of the Schottky barrier diode is prevented from becoming too low, thereby preventing the reverse off-leak current from becoming too large.

Moreover, the cathode diffusion layer is formed of the two diffusion layers of one conductivity type having different impurity concentrations. Thus, a higher breakdown voltage can be achieved.

What is claimed is:

1. A semiconductor device comprising:
a semiconductor layer of a first general conductivity type;
a first anode diffusion layer of a second general conductivity type formed in the semiconductor layer;
a second anode diffusion layer of the second general conductivity type formed in the semiconductor layer and separated from the first diffusion layer, the second anode diffusion layer surrounding the first anode diffusion layer in plan view of the semiconductor device;
a third anode diffusion layer of the second general conductivity type formed in the semiconductor layer so that the first and second anode diffusion layers are confined within a lateral area of the third anode diffusion layer and are physically in contact with the third anode diffusion layer;
a cathode diffusion layer of the first general conductivity type formed in the semiconductor layer and not being disposed in the lateral area of the third anode diffusion layer; and
a Schottky barrier metal layer disposed on the first, second and third anode diffusion layers and confined within the lateral area of the third anode diffusion layer in plan view of the semiconductor device.

2. The semiconductor device of claim 1, wherein the cathode diffusion layer comprises two diffusion layers of the first general conductivity type having different impurity concentrations and is connected to a cathode electrode.

3. The semiconductor device of claim 1, wherein an impurity concentration of the third anode diffusion layer is lower than impurity concentrations of the first and second anode diffusion layers.

4. The semiconductor device of claim 2, wherein an impurity concentration of the third anode diffusion layer is lower than impurity concentrations of the first and second anode diffusion layers.

5. The semiconductor device of claim 1, further comprising an electric field shielding film formed on the semiconductor layer and a wiring layer to which an anode potential is applied, wherein the electric field shielding film is configured to receive the same electric potential as applied to the cathode diffusion layer and placed where the wiring layer intersects the cathode diffusion layer.

6. The semiconductor device of claim 2, further comprising an electric field shielding film formed on the semiconductor layer and a wiring layer to which an anode potential is applied, wherein the electric field shielding film is configured to receive the same electric potential as applied to the cathode diffusion layer and placed where the wiring layer intersects the cathode diffusion layer.

7. The semiconductor device of claim 3, further comprising an electric field shielding film formed on the semiconductor layer and a wiring layer to which an anode potential is applied, wherein the electric field shielding film is configured to receive the same electric potential as applied to the cathode diffusion layer and placed where the wiring layer intersects the cathode diffusion layer.

8. The semiconductor device of claim 4, further comprising an electric field shielding film formed on the semiconductor layer and a wiring layer to which an anode potential is applied, wherein the electric field shielding film is configured to receive the same electric potential as applied to the cathode diffusion layer and placed where the wiring layer intersects the cathode diffusion layer.

9. The semiconductor device of claim 1, wherein the cathode diffusion layer surrounds the first, second and third anode diffusion layers.

10. The semiconductor device of claim 1, wherein in the plan view of the semiconductor device the third anode diffusion layer extends beyond an outer edge of the second anode diffusion layer surrounding the first anode diffusion layer.

11. The semiconductor device of claim 1, further comprising an embedded diffusion layer of the second general conductivity type formed in a surface portion of the second anode diffusion layer and having an impurity concentration higher than an impurity concentration of the second anode diffusion layer.

12. The semiconductor device of claim 11, further comprising another embedded diffusion layer of the second general conductivity type formed in a surface portion of the first anode diffusion layer and having an impurity concentration higher than an impurity concentration of the first anode diffusion layer.

* * * * *